United States Patent [19]

Miya

[11] Patent Number: 5,751,033
[45] Date of Patent: May 12, 1998

[54] FREQUENCY CONVERTER CIRCUIT STRUCTURE HAVING TWO SOURCES

[75] Inventor: Tatsuya Miya, Tokyo, Japan

[73] Assignee: NEC Corporation, Japan

[21] Appl. No.: 676,914

[22] Filed: Jul. 8, 1996

Related U.S. Application Data

[63] Continuation of Ser. No. 394,885, Feb. 27, 1995, abandoned.

[30] Foreign Application Priority Data

Mar. 15, 1994 [JP] Japan ................... 6-043421

[51] Int. Cl.$^6$ ................................................... H01L 29/80
[52] U.S. Cl. ....................... 257/270; 257/365; 257/287; 257/401; 257/206
[58] Field of Search ........................ 327/113, 298, 327/355; 455/313, 323, 333; 257/365, 287, 401, 270, 206

[56] References Cited

U.S. PATENT DOCUMENTS

| | | | |
|---|---|---|---|
| 4,112,373 | 9/1978 | Miyamoto et al. | 455/333 |
| 4,313,126 | 1/1982 | Krumm et al. | 257/287 |
| 4,315,272 | 2/1982 | Vorhaus | 257/270 |
| 4,751,744 | 6/1988 | Pavio, Jr. | 455/333 |
| 4,845,389 | 7/1989 | Pyndiah et al. | 327/113 |
| 5,341,111 | 8/1994 | Miya et al. | 331/96 |

FOREIGN PATENT DOCUMENTS

| | | | |
|---|---|---|---|
| 2 597 262 | 10/1987 | France | 257/392 |
| 2836268 | 3/1979 | Germany | 257/270 |
| 62-206887 | 9/1987 | Japan | 257/392 |
| 63-142908 | 6/1988 | Japan | H03D 7/12 |
| 0289304 | 11/1989 | Japan . | |
| 1-289304 | 11/1989 | Japan | H03D 7/12 |
| 5-055486 | 3/1993 | Japan | 257/206 |
| 5-055487 | 3/1993 | Japan | 257/206 |

*Primary Examiner*—Tom Thomas
*Assistant Examiner*—David B. Hardy
*Attorney, Agent, or Firm*—Hayes, Soloway, Hennessey, Grossman & Hage, P.C.

[57] ABSTRACT

A frequency converter has low noise figure and high conversion gain characteristics, and can drive directly a 50 Ohm load. In one embodiment, a dual-gate FET is employed that is composed of a first and second FET as the frequency mixing elements, and a third FET is connected in parallel to the first. The gate voltage of the first FET is set to be substantially equal to the pinch-off voltage in order to thereby ensure low noise figure. The second FET is set to a high $g_m$, from which a frequency-converted signal is outputted. The gate bias of the third FET is set to provide a path for the current flowing through the second FET. As a result, the second FET can be set to a high $g_m$ regardless of the gate voltage of the first FET, in order to ensure high conversion gain.

4 Claims, 5 Drawing Sheets

1

FREQUENCY CONVERTER CIRCUIT STRUCTURE HAVING TWO SOURCES

This is a continuation of application Ser. No. 08/394,885, filed on Feb. 27, 1995, now abandoned.

BACKGROUND OF THE INVENTION

1. Field of the Invention

The present invention relates to a frequency converter that employs a dual-gate FET as a frequency mixing element, and in particular to a frequency converter that handles signals in the microwave band.

2. Description of the Related Art

Dual-gate FETs have conventionally been used as frequency mixing elements in frequency converters (hereinafter abbreviated as "mixers"). FIG. 1 shows the composition of dual-gate FET mixer of the prior art. This mixer is made up of dual gate FET 5 for frequency mixing, matching circuit 6 for a RF frequency band, matching circuit 7 for a local frequency band, and matching circuit 8 for an IF frequency band. Here, the symbols $G_{11}$, $G_{12}$ D, and S labeling each terminal of dual-gate FET 5 denote the first gate, second gate, drain, and source, respectively. As shown in FIG. 1, an RF signal is supplied to the first gate by way of matching circuit 6, and a local signal is applied to the second gate by way of matching circuit 7. It is common for an IF signal to be derived from the drain by way of matching circuit 8. Frequency mixing is believed to be principally caused by the transconductance (hereinafter abbreviated as "$g_m$") of FET 5, as viewed from the first gate, modulated at a local frequency by a local signal applied to the second gate, with the modulated component thereof coupled with the RF signal voltage supplied to the first gate through the gate-source capacity. The magnitude of the IF component of the generated frequency-mixed components depends on the coefficient $g_1$, for the fundamental oscillation of Fourier series, i.e., for k=1, wherein $$g_m = \Sigma\, g_k \cos k\omega_0 t \qquad (1)$$

and the greater $g_1$, the greater the conversion gain from RF frequency toward IF frequency. In formula (1), k is a non-negative integer, and $\Sigma$ is the sum from k=0 to k=∞.

To make $g_1$ greater, $g_m$ itself must be made greater, but when a dual-gate FET is actually employed as a mixer, it is normal in order to reduce noise figure to deeply bias the first gate of the mixer such that the drain current will be considerably smaller than the saturation drain current when the first gate is short-circuited to the source. In other words, the mixer is operated in such a state in which the current is reduced by applying to the first gate a voltage that is close to the cut-off voltage (hereinafter abbreviated as "$V_{th}$") of the FET. In FIG. 2, the dual-gate FET is represented as a serial connection of two FETs 11, 12, the circuit of FIG. 2 being equivalent to the dual-gate FET 5 of FIG. 1. In the following description, parts equivalent to FET11 of dual-gate FET 5 are referred to as the FET relating to the first gate, and parts equivalent to FET12 are referred to as the FET relating to the second gate. In the above-described dual-gate mixer of the prior art, $g_m$ is also lowered because the current is suppressed to a low level, and as a result, $g_1$ is also reduced and conversion gain cannot be increased. In order to raise the value of $g_m$ at the operating point, it is also proposed to reduce the absolute value of the $V_{th}$ of the FET.

However, because FETs relating to the first and second gates of a prior art dual-gate FET have identical structures, the cut-off voltage $V_{th}$ relating to both gates is equal, and accordingly, when the absolute value of the cut-off voltage for the first gate is small, the absolute value of the $V_{th}$ for the second gate will also be small. As a result, there is the problem that when the second gate is driven by a local signal, which is normally strong, the cut-off period of the dual gate mixer lengthens due to the small absolute value of the cut-off voltage, imposing a limit on the increase of $g_1$.

Directed to solving this problem, a dual-gate FET is disclosed in Japanese Patent Laid-open No. 289304 (1989) in which the dual-gate FET is formed so that the cut-off voltages $V_{th}$ for the first and second gates differ. FIGS. 3 and 4 show section views of the construction of the dual-gate FET disclosed in this patent publication. The FET shown in FIG. 3 is formed such that the concentration of impurities $n_2$ in the active layer underlying the second gate is greater than that of impurities $n_1$ in the active layer underlying the first gate. The FET shown in FIG. 4 is formed such that the active layer underlying the second gate is thicker than the active layer underlying the first gate. Thus, the above-described problem can be obviated by varying the injection conditions for the active layers underlying each gate so that the absolute value of the $V_{th}$ for the first gate is reduced in order to make $g_1$ as great as possible, and that the absolute value of the $V_{th}$ for the second gate is increased. Although this prior art affords an increase in conversion gain, the increase of $g_1$ is still limited even though the absolute value of the $V_{th}$ for the first gate is small, because the drain current itself is limited small by the first gate.

As described hereinabove, the current in a dual-gate FET mixer of the prior art is suppressed to a low level to reduce the noise figure. As a result, $g_m$ at the operating point is small and conversion gain cannot be made high. Although it is possible to increase $g_m$ by making the absolute value of $V_{th}$ of the FET small or, as shown by the prior art in the above-described patent application, by varying the injection conditions in the layer below each gate, there remains a limit to the increase of $g_m$ when these types of methods are employed. Furthermore, because the output current of a dual-gate FET mixer of the prior art is small, the load driving power is also small, and consequently, it has not been possible to connect a load of 50 Ω characteristic, for example, a 50 Ω coaxial cable directly to the output circuit of the mixer. As a result, when taking out an IF signal from the mixer, it has been necessary to connect an impedance matching circuit or an impedance converter to the output circuit to take out the IF signal.

The object of the present invention is to provide a frequency converter with a low noise figure having a high $g_m$ capable of driving a low-impedance load without an impedance matching circuit.

SUMMARY OF THE INVENTION

To achieve the above-described object, the frequency converter of the present invention has a dual-gate FET as a frequency mixing element provided with a first gate that receives a first signal, a second gate that receives a second signal and a drain from which an IF signal is provided, said frequency converter also having a third FET that is connected in parallel to the first FET and that has a gate voltage biased such that a drain current flows which is substantially equal to the drain current of the second FET at the operating point thereof, with the first gate being biased to be substantially equal to the pinch off voltage, wherein the portion of the FET relating (operationally coupled) to the first gate is referred to as the first FET and the portion of the FET relating to the second gate is referred to as the second FET.

Thus, by connecting the third FET in parallel to the first FET to establish a current path from the second FET to the third FET, it becomes possible to set to a high value the transconductance, as seen from the first gate, of the frequency converter regardless of the value of the gate bias of the first FET. Consequently, even if the first gate is biased to be substantially equal to the pinch-off voltage to reduce the noise figure (hereinafter abbreviated as "NF") of a first signal, a high frequency conversion gain (high gain) for the first signal can be obtained by establishing the transconductance high at the operating point of the second FET. In this way, a frequency converter having low NF and high gain can be realized.

In the case that the dual-gate FET and the third FET are of depletion-type, it is desirable to set the bias voltage of the second gate such that the drain current at the operating point of the second FET is substantially (½) $I_{DSS}$, wherein $I_{DSS}$ stands for the saturation drain current of the second FET at the time of gate-source short-circuit.

When depletion-type FETs are employed in the dual-gate FET and third FET, the biases of the FETs can easily be established, because it is possible to set the biases by using as a standard the saturation drain current $I_{DSS}$ produced by short-circuiting the gate and source of the second FET. When the drain current at the operating point of the second FET is set to (½) $I_{DSS}$, the range of current clip narrows, thereby enabling the frequency conversion gain to be increased even when the second signal has a large amplitude.

In addition, it is desirable that the channel width of the third FET be substantially half the channel width of the second FET.

When $I_{DSS}$ of the second and third FETs is $I_{DSS2}$ and $I_{DSS3}$, respectively, and the channel width of the third FET is formed so as to be ½ the channel width of the second FET, $I_{DSS3}=(½) I_{DSS2}$. On the other hand, if the gate bias of the first FET is set to the vicinity of the pinch-off voltage $V_{th}$, the drain current $I_{D1}$ of the first FET will decrease, and consequently the drain currents $I_{D2}$ and $I_{D3}$ of the second and third FETs will be substantially equal. Consequently, when the drain current at the operating point of the second FET is set to (½) $I_{DSS2}$, the gate bias of the third FET must be set such that the saturation drain current of the third FET is (½) $I_{DSS2}=I_{DSS3}$. This can easily be achieved by short-circuiting the gate and source of the third FET.

Further, the dual-gate FET and the third FET can be made self-biased. Through self-biasing, it is possible to have the frequency converter carry out the above-described operations automatically.

It is possible to connect a series resonance circuit having a resonance frequency equal to the frequency of the second signal between the second gate and a common potential, and output the frequency-converted signal from the drain of the second FET.

When a series resonance circuit is connected between the second gate and the common potential (ground terminal), the series resonance circuit both works as a filter of the second signal and has a low impedance for the frequency-converted output frequency. As a result, the second FET functions as an amplifier of the common gate drive (gate ground) for the output frequency, thereby increasing the frequency conversion gain.

It is preferable that the above-described frequency converter be constructed monolithically together with other semiconductor circuits.

Thus, according to the present invention, by deeply biasing the first gate so that a drain current flows which is considerably smaller than the saturation current at the time of gate-source short-circuit, the noise figure of the first FET can be reduced, and by causing the greater part of the drain current of the second FET to flow to the third FET, the second FET can be set to a high transconductance. In this way, a frequency converter having high conversion gain and low NF can be realized.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 1:
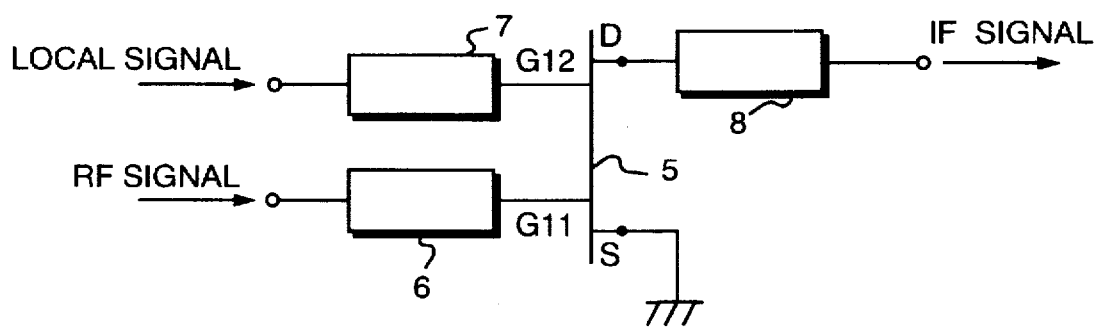
FIG. 1 shows a structural diagram of a dual-gate mixer of the prior art.
Figure 2:
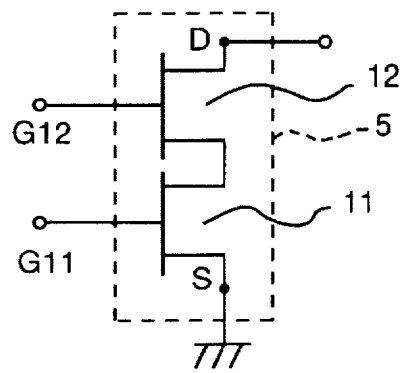
FIG. 2 shows a dual-gate FET represented as serially connected two FETs.
Figure 3:
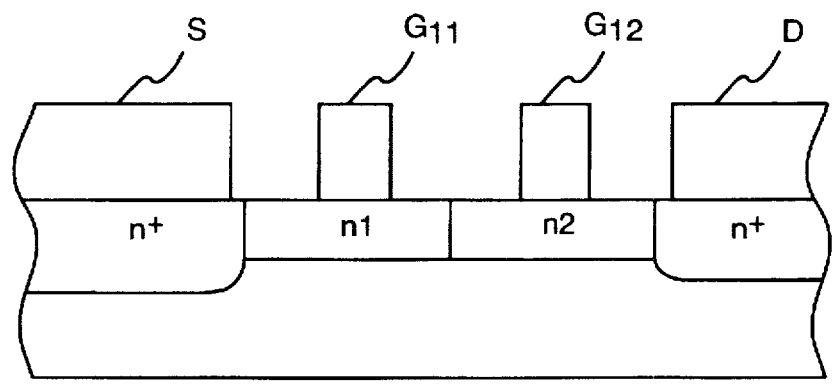
FIG. 3 is a sectional view of the construction of an example of a dual-gate FET of the prior art.
Figure 4:
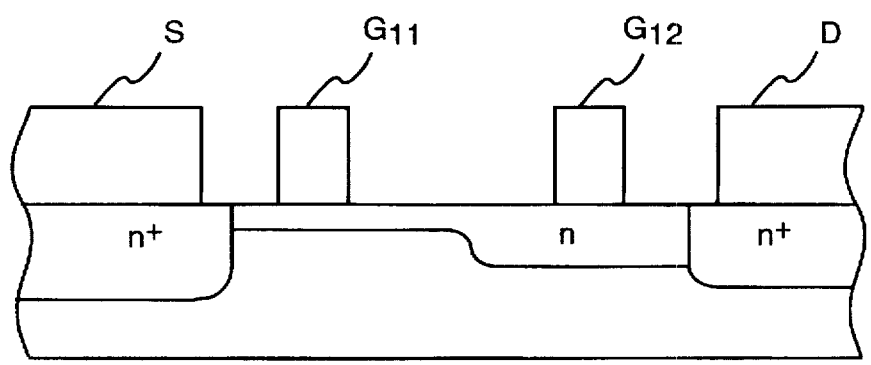
FIG. 4 is a sectional view of the construction of an example of a dual-gate FET of the prior art.
Figure 5:
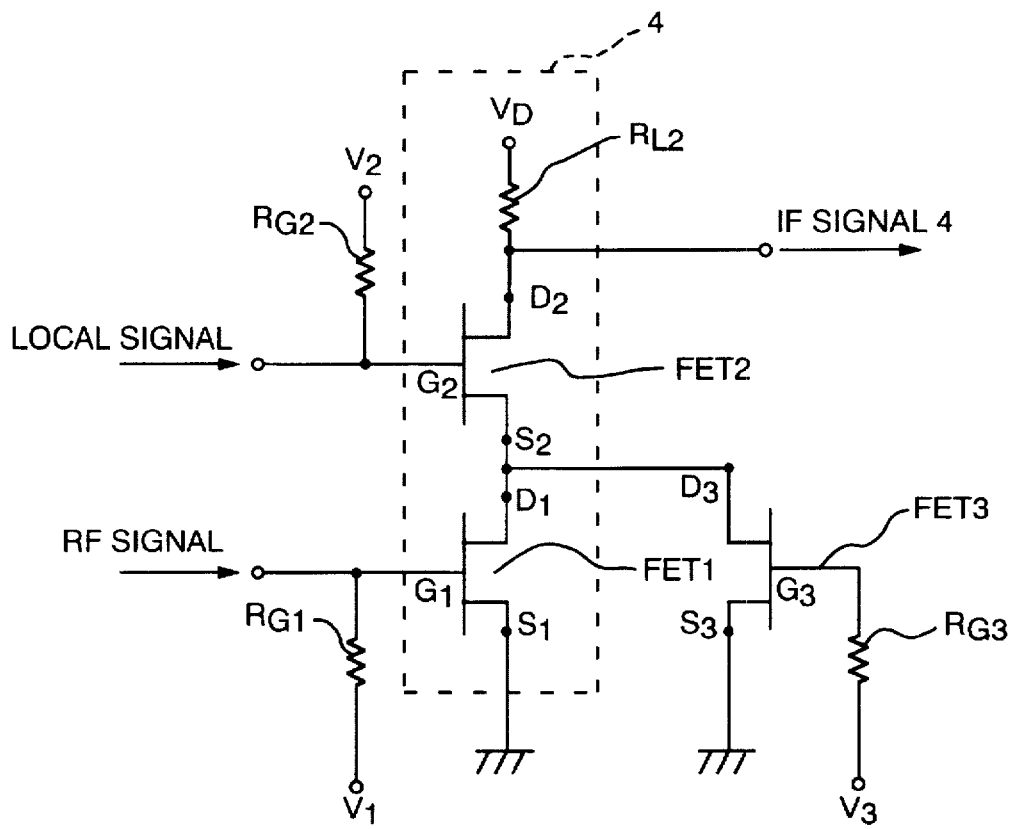
FIG. 5 shows a circuit diagram of a first embodiment of the present invention.

Explanation of the embodiments of the present invention will next be presented with reference to the figures. FIG. 5 is a circuit diagram of a first embodiment of the frequency converter of the present invention. This embodiment is an example of the application of the frequency converter of the present invention to an FM receiver.

The frequency converter is provided with FET 3 and dual-gate FET 4, both of which are depletion-type N-channel FETs. In the following explanation, the portion of dual-gate FET 4 having operationally to do with gate $G_1$ is referred to as FET1, and the FET portion having operationally to do with gate $G_2$ is referred to as FET2. Further, operation of each of these FETs in the saturation region with the gate and source being short-circuited is referred to as an $I_{DDS}$ operation, and the saturation drain current in the $I_{DSS}$ operation is referred to as short-circuit saturation current $I_{DSS}$.

In the present embodiment, the source of dual-gate FET 4, i.e., source $S_1$ of FET1, is grounded, and the drain, i.e., drain $D_2$ of FET2 is connected to power source $V_D$ by way of load resistance $R_{L2}$. In addition, FET3 is connected in parallel with FET1, and the voltage of gate G3 is biased, via $R_{G3}$, such that a drain current flows which is substantially equal to the drain current of FET2. Thus, by the addition of FET3, a current path from FET2 to FET3 is established, and the operating point of FET2 can be set to a high $g_m$ regardless of the gate bias, set by $R_{G1}$, of FET1. As shown in FIG. 5, an RF signal is supplied to gate G1, and a local signal (local oscillator signal) is supplied to gate $G_2$. An IF (intermediate frequency) signal is provided from drain $D_2$. Gate bias $V_1$, via $R_{G1}$, of FET1 is set in the vicinity of the pinch-off voltage to reduce the noise figure. Gate bias $V_2$, via $R_{G2}$, of FET2 is set such that its drain current has an operating point in the vicinity of (½) $I_{DSS2}$. Here, $I_{DSS2}$ is the short-circuit saturation current of FET2. Gate bias $V_3$, via $R_{G3}$, of FET3 is set such that the drain bias current of FET3 has substantially the same magnitude as the drain bias current of FET2, (½) $I_{DSS2}$.

In operation of the present embodiment, an RF signal is supplied to gate $G_1$, and a local signal is supplied to gate $G_2$. Since the gate bias $V_1$ of gate $G_1$ is set (by $R_{G1}$) to the vicinity of the pinch-off voltage, FET1 is of low NF but its drain current is small. As a result, a drain current flows through FET3 which is nearly equal to the drain current of FET2. Normally, the local signal has a large amplitude. However, since the drain bias current of FET2 is set (by $R_{L2}$) to (½) $I_{DSS2}$, current clip occurs within a limited range and thus conversion gain increases.

As described above, in the present embodiment, drain current of FET2 is designed regardless of the gate bias $V_1$ of FET1. Accordingly, $g_m$ of FET2 can be made high to cause a high conversion gain to be obtained. In the present embodiment, the channel widths of FET1, 2, and 3 are 200 μm, $V_{th}$ is −1.0 V, $V_1$ is set to between −0.5 and −0.8 V, $V_2$ to between 1 and 3 V, and $V_3$ to between 0.2 and 0.4 V. Through these settings, it is possible to realize a high-power frequency converter of low noise figure capable of driving a 50 Ω load without any impedance matching circuit.

Figure 6:
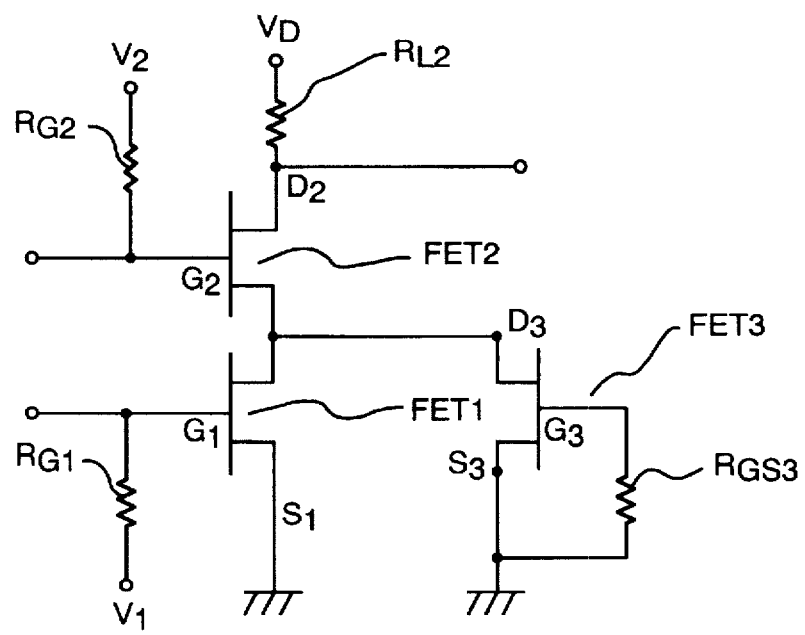
FIG. 6 shows a circuit diagram of a second embodiment of the present invention.

FIG. 6 shows a circuit diagram of a second embodiment of the present invention. In this embodiment, the channel width of FET3 is substantially half that of FET2, and as in the embodiment of FIG. 5, gate bias $V_2$ of FET2 is set (by $R_{G2}$) such that the saturation drain current of FET2 is (½) $I_{DSS2}$. The gate of FET3 is connected to the ground potential and the source thereof is also connected to the ground potential via a protecting resistor. Since substantially no current flows through the protection resistor, the gate and source are at equipotential. Accordingly, in the saturation region, a short-circuit saturation current $I_{DSS3}$ equal to (½) $I_{DSS2}$ flows through FET3. In this way, by merely placing the gate and source at equipotential, via $R_{G3}$, the drain current characteristic of FET3 can be established such that the drain current (½) $I_{DSS2}$ set in FET2 flows through FET3, whereby the circuit shown in FIG. 6 can achieve the same effect as the circuit shown in FIG. 5.

Figure 7:
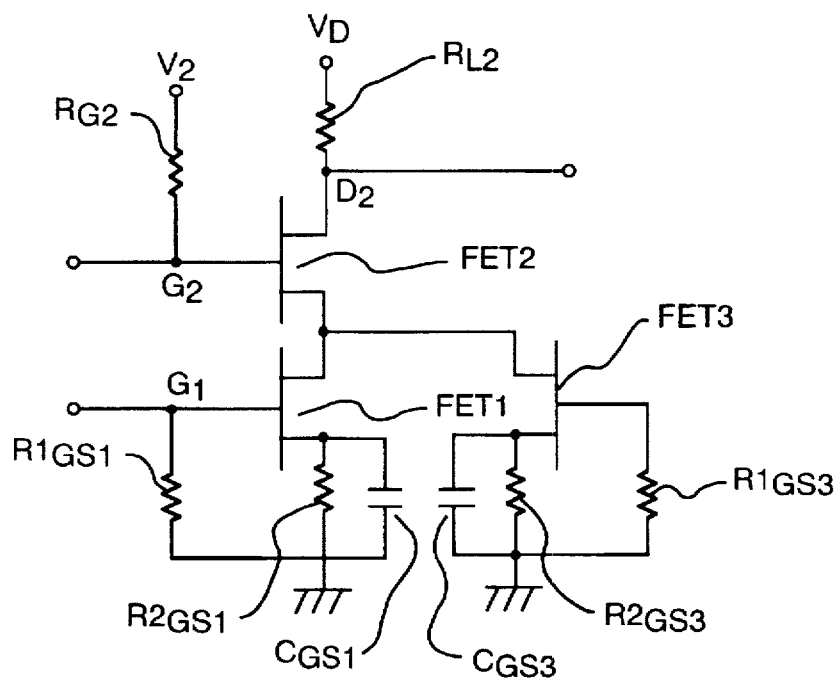
FIG. 7 shows a circuit diagram of a third embodiment of the present invention.

FIG. 7 shows a circuit diagram of a third embodiment of the present invention. In this embodiment, a resistance and a capacitor (labeled $R2_{GS1}$, $C_{GS1}$, and $R2_{GS3}$, $C_{GS3}$), connected in parallel are connected between the ground and each of the sources of FET1 and FET3 to provide self-biases. The self-biasing circuit of FET1 generates a bias voltage to place the gate-source voltage of FET1 in the vicinity of the pinch-off voltage. The self-biasing circuit of FET3 generates a bias voltage to make the saturation drain current of FET3 equal to the drain current of FET2.

Figure 8:
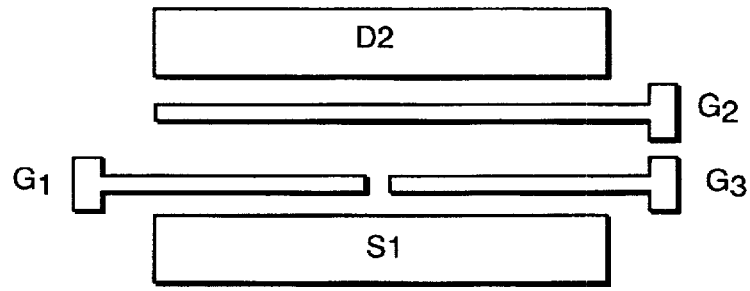
FIG. 8 shows the FET structure of a frequency converter according to the present invention.
Figure 9:
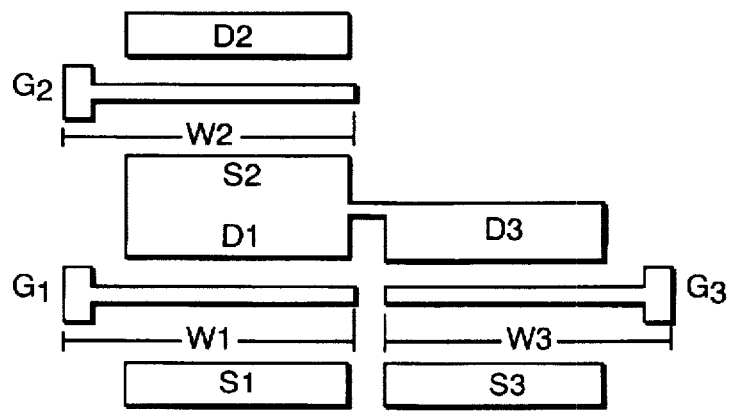
FIG. 9 shows the FET structure of a frequency converter according to the present invention.

FIGS. 8 and 9 illustrate the FET structure of a dual-gate FET frequency converter according to the present invention. The FETs of FIGS. 8 and 9 are identical in terms of equivalent circuits, but the FET of FIG. 9 differs from the FET of FIG. 8 in that drain and source electrodes are provided for each of the FETs relating to each gate of FIG. 8, each of the FETs of FIG. 9 thereby being structured as independent FETS.

Figure 10:
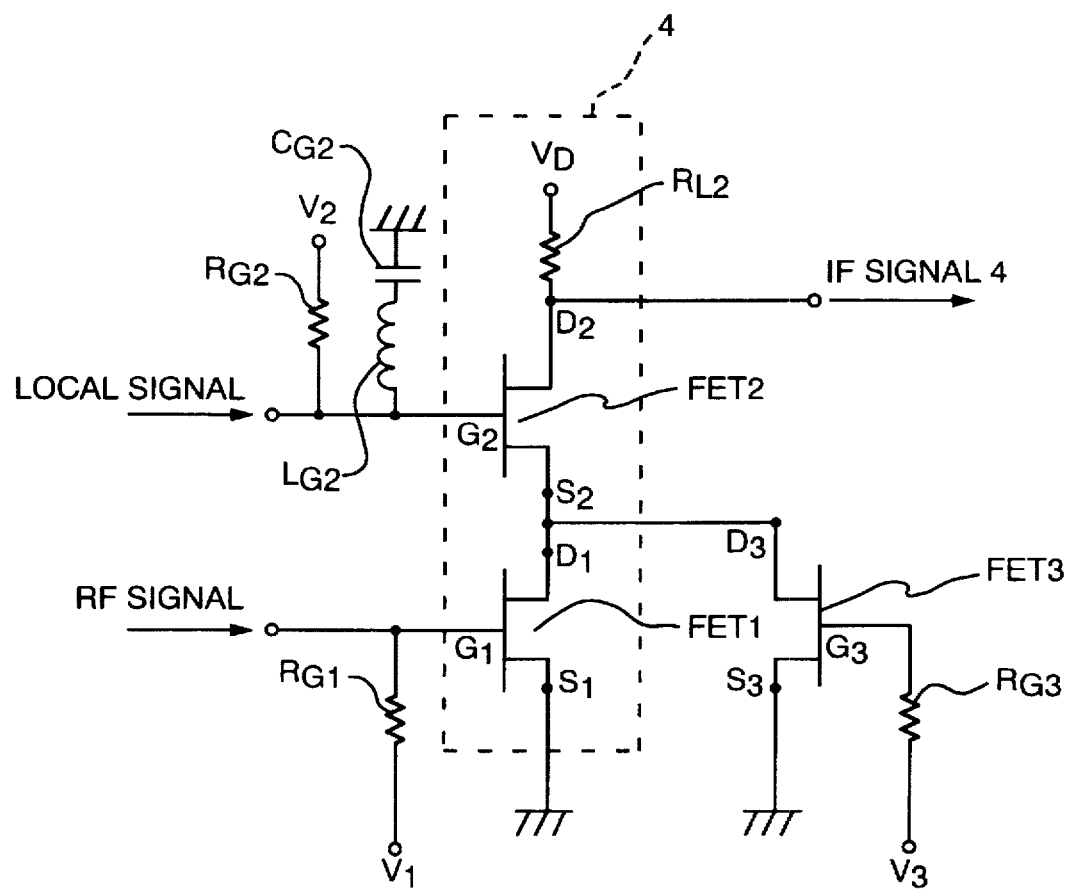
FIG. 10 is a circuit diagram of a fourth embodiment of the present invention.

FIG. 10 shows a circuit diagram of a fourth embodiment of the present invention. This embodiment is a frequency converter in which the gate circuit of FET2 of FIG. 5 is provided with a series resonance circuit (shown in FIG. 10 by the RLC circuit of $R_{G2}$, $L_{G2}$, and $C_{G2}$). Each gate bias of the FETs making up the frequency converter of the present embodiment is set similarly to the circuit of FIG. 5. The resonance frequency of the series resonance circuit is equal to the frequency of the local signal, and this resonance circuit functions on one hand as a filter for the local signal, and on the other hand, as the low impedance for the IF signal. Accordingly, FET2 acts as an amplifier of the gate ground connection for an IF signal. As a result, a higher gain can be obtained in the frequency converter of FIG. 10 than in the frequency converter of FIG. 5.

The present invention may be summarized as follows:

1) By parallel connecting the third FET to the first FET, a second FET that outputs a frequency-converted signal can be set to high $g_m$ regardless of the gate bias of the first FET, and as a result, a frequency converter having large frequency conversion gain can be realized. Because the second FET can operate at a high $g_m$, a relatively large current can flow through the second FET, by which the frequency converter can directly drive a 50 Ω load, thereby providing a greater degree of freedom in the design of the peripheral circuits of the frequency converter.

2) By setting the gate bias of a first FET to the vicinity of the pinch-off voltage, low noise figure can be achieved without losing high-gain frequency conversion characteristics.

3) By setting the operating point of the drain current of a second FET to ½ the short-circuit saturation current of that FET, the range of current clip can be limited even when the amplitude of the second signal supplied to the gate of the second FET is large, thereby enabling an increase in conversion gain.

4) By making the channel width of a third FET one half the channel width of a second FET, the effect described in item 3 above can be achieved by merely short-circuiting the gate and source of the third FET.

5) By self-biasing gate voltage, the effects described in items 1 to 4 above may be achieved without necessitating complicated processes.

6) By providing between the gate of the second FET and a common potential a series resonance circuit having a resonance frequency equal to the frequency of the second signal, the second FET can be made to function as an amplifier of the common gate connection for the frequency-converted IF signal, thereby enabling an increase in frequency conversion gain.

7) Monolithically forming the frequency converter together with other circuits facilitates both the setting of gate biases and the design of the frequency converter as well as of peripheral circuits.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A frequency converting circuit for high conversion gain comprising as a frequency mixing element, a first FET provided with a first, a second, and a third gate, said first FET having first and second sources which are aligned with each other and also having a drain, the first and second sources of said first FET being formed in parallel to said drain; and first and third gates being aligned with each other, the second gate being formed along one straight line and the first and third gates being formed along another straight line, said straight lines being located between and parallel to said drain and said sources, said one straight line being on the drain side of said straight lines and extending over a whole width of said drain, and said other line being on the source side of said straight lines so that said first gate controls a drain current which flows between said drain and said first source and also so that said third gate controls a drain current which flows between said drain and said second source; and said first FET also having a diffusion region formed between said second gate, and said first and third gates, so that said diffusion region acts as a source of a second FET which comprises the drain of said first FET, the second gate and the diffusion region acting as drains of both said first FET and a third FET which comprises the diffusion region, the first and third gates, and the first and second sources of the first FET, respectively;

wherein said first gate is biased to be substantially equal to a pinch-off voltage and said third gate is biased so that a major part of a drain current of the first FET passes through the third FET.

2. A frequency converting circuit according to claim 1, wherein the channel widths of said first, second and third gates are equal.

3. A frequency converting circuit for high conversion gain having, as a frequency mixing element, a FET provided with a first, a second, and a third gate, said FET having first and second sources which are aligned in a line and a drain, the aligned sources of said FET being formed in parallel to said drain; and said first and third gates being aligned in a line and said second gate and the aligned first and third gates being formed along two straight lines located between and parallel to said drain and said sources, the second gate being formed along a first line on the drain side of said two straight lines extending over a whole width of said drain, and the first and third gates being formed along a second line on the source side of said two straight lines so that said first gate controls and a drain current which flows between said drain and said first source and that said third gate controls a drain current which flows between said drain and said second source; wherein said first gate is biased to be substantially equal to a pinch-off voltage and said third gate is biased so that major part of a drain current, which flows from the drain of said FET, flows to said second source.

4. A frequency converting circuit according to claim 3, wherein the channel widths of said first, second and third gates are equal.

* * * * *